United States Patent
Lin et al.

(10) Patent No.: US 8,648,640 B1
(45) Date of Patent: Feb. 11, 2014

(54) METHOD AND APPARATUS FOR CLOCK TRANSMISSION

(71) Applicant: Realtek Semiconductor Corp., Hsinchu (TW)

(72) Inventors: Chia-Liang (Leon) Lin, Fremont, CA (US); Gerchih (Joseph) Chou, San Jose, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 0 days.

(21) Appl. No.: 13/656,771

(22) Filed: Oct. 22, 2012

(51) Int. Cl.
*H03K 3/00* (2006.01)

(52) U.S. Cl.
USPC .............. 327/299; 327/291; 327/398; 326/82

(58) Field of Classification Search
USPC ......... 327/291, 292, 298–299, 392, 398–399; 326/82–83, 89
See application file for complete search history.

(56) References Cited

U.S. PATENT DOCUMENTS

| | | | | |
|---|---|---|---|---|
| 5,936,429 | A * | 8/1999 | Tomita | 326/82 |
| 6,750,692 | B2 * | 6/2004 | Jang | 327/291 |
| 7,948,282 | B2 * | 5/2011 | Fukumoto | 327/131 |
| 8,149,039 | B1 * | 4/2012 | Wang et al. | 327/291 |

* cited by examiner

*Primary Examiner* — An Luu
(74) *Attorney, Agent, or Firm* — McClure, Qualey & Rodack, LLP

(57) ABSTRACT

Apparatus and methods are provided for an extraction circuit. In one configuration, an apparatus includes: an edge extraction circuit for receiving a first clock signal and outputting a second clock signal, wherein a duty cycle of the second clock is substantially smaller than a duty cycle of the first clock; a transistor for receiving the second clock signal and outputting a current signal; a transmission line for receiving the current signal on a first end and transmitting the current signal to a second end; a termination circuit for receiving the current signal at the second end and converting the current signal into a voltage signal; and an edge detection circuit for outputting a third clock by detecting an edge of the voltage signal. In one embodiment, the edge detection circuit comprises an inverter. In another embodiment, the edge detection circuit comprises a comparator.

15 Claims, 2 Drawing Sheets

METHOD AND APPARATUS FOR CLOCK TRANSMISSION

BACKGROUND OF THE INVENTION

1. Field of the Invention

The present invention relates to transmission of a clock signal.

2. Description of Related Art

Clocking is widely used in integrated circuits. A clock signal is usually a square wave. In integrated circuits, a clock signal is usually derived from a crystal oscillator, and then transmitted to various parts of the integrated circuits. Therefore, efficient clock transmission is typically needed. FIG. 1 depicts a schematic diagram of a typical clock transmission circuit 100. Circuit 100 comprises: an NMOS (n-channel metal-oxide semiconductor field effect) transistor 110 for receiving a source clock signal CLK_SRC and outputting a current signal $I_{CLK}$, a transmission line 120 for receiving the current signal $I_{CLK}$ on a first end 121 and transmitting the current signal $I_{CLK}$ to a second end 122; and a termination device 130 embodied as a resistor 130 for coupling to the second end 122 of the transmission line 120, thereby resulting in a destination clock CLK_DES. Throughout this disclosure, $V_{DD}$ denotes a power supply node. In integrated circuits, however, there are usually many coexisting circuits and signals. The transmission line 120, while transmitting the current signal $I_{CLK}$, may pick up noise from nearby circuits and signals that may degrade the quality of the clock signal. To ensure good quality of the destination clock CLK_DES, the amplitude of the current signal $I_{CLK}$ should be relatively large while the impedance of the termination device 130 should be kept relatively small. However, this typically increases power consumption.

A need therefore exists for a clock transmission method that ensures a good signal quality at the destination without large power consumption.

BRIEF SUMMARY OF THIS INVENTION

In one embodiment, an apparatus comprises: an edge extraction circuit for receiving a first clock signal and outputting a second clock signal, wherein a duty cycle of the second clock is substantially smaller than a duty cycle of the first clock; a transistor for receiving the second clock signal and outputting a current signal; a transmission line for receiving the current signal on a first end and transmitting the current signal to a second end; a termination circuit for receiving the current signal at the second end and converting the current signal into a voltage signal; and an edge detection circuit for outputting a third clock by detecting an edge of the voltage signal. In one embodiment, the edge detection circuit comprises an inverter. In another embodiment, the edge detection circuit comprises a comparator.

In one embodiment, an apparatus comprises: an edge extraction circuit for receiving a first clock signal and outputting a second clock signal, wherein a duty cycle of the second clock is substantially smaller than a duty cycle of the first clock; a transistor for receiving the second clock signal and outputting a current signal; a transmission line for receiving the current signal on a first end and transmitting the current signal to a second end; a current mirror for receiving the current signal at the second end and mirroring the current signal into a mirrored current signal; a termination circuit for receiving the mirrored current signal and converting it into a voltage signal; and an edge detection circuit for outputting a third clock by detecting an edge of the voltage signal. In one embodiment, the edge detection circuit comprises an inverter. In another embodiment, the edge detection circuit comprises a comparator.

In one embodiment, a method comprises: receiving a first clock signal; generating a second clock signal using a edge extraction circuit such that a period of the second clock signal is the same as a period of the first clock signal yet a duty cycle of the second clock signal is substantially smaller than a duty cycle of the first clock signal; using a transistor to convert the second clock signal into a current signal; transmitting the current signal onto a transmission line at a first end; receiving the current signal at a second end of the transmission line; converting the current signal received at the second end of the transmission line into a voltage signal using a termination circuit; and generating a third clock from the voltage signal using an edge detection circuit. In one embodiment, the edge detection circuit comprises an inverter. In another embodiment, the edge detection circuit comprises a comparator.

In one embodiment, a method comprises: receiving a first clock signal; generating a second clock signal using a edge extraction circuit such that a period of the second clock signal is the same as a period of the first clock signal yet a duty cycle of the second clock signal is substantially smaller than a duty cycle of the first clock signal; using a transistor to convert the second clock signal into a current signal; transmitting the current signal onto a transmission line at a first end; receiving the current signal at a second end of the transmission line; mirroring the current signal received at the second end of the transmission line to generate a mirrored current signal using a current mirror; converting the mirrored current signal into a voltage signal using a termination circuit; and generating a third clock from the voltage signal using an edge detection circuit. In one embodiment, the edge detection circuit comprises an inverter. In another embodiment, the edge detection circuit comprises a comparator.

DETAILED DESCRIPTION

The present disclosure relates to clock transmission, and in particular, to clock transmissions in integrated circuits. While the specification describes several example embodiments of the disclosure that are considered best modes of practicing the clock transmission embodiments disclosed, it should be understood that the various embodiments may be implemented in many ways and is not limited to the particular examples described below or to the particular manner in which any features of such examples are implemented. In other instances, well-known details are not shown or described to avoid obscuring aspects of the present disclosure.

Figure 1:
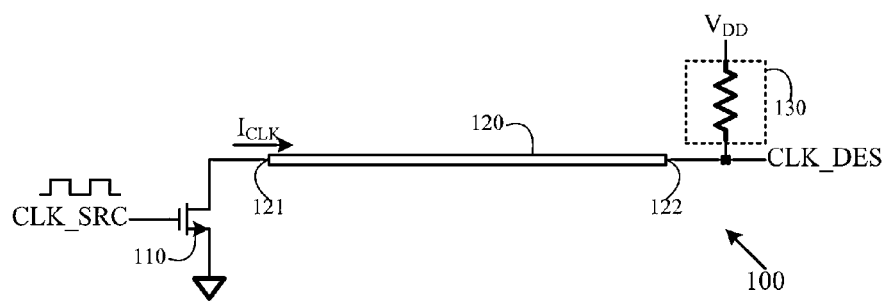
FIG. 1 shows a schematic diagram of a clock transmission circuit.
Figure 2:
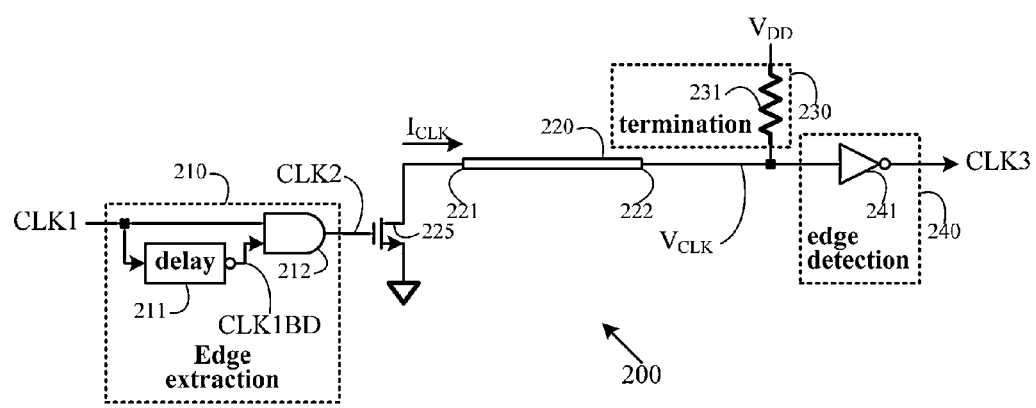
FIG. 2 shows a schematic diagram of a clock transmission circuit in accordance with an embodiment of the present disclosure.

An exemplary circuit 200 in accordance with an embodiment of the present disclosure is depicted in FIG. 2. Circuit 200 comprises: an edge extraction circuit 210 (comprising an inverting delay cell 211 and an AND gate 212, in this particular embodiment) for receiving a first clock CLK1 and outputting a second clock CLK2, wherein an edge (which is a rising edge, in this particular embodiment) of the second clock CLK2 is associated with an edge (which is a rising edge, in this particular embodiment) of the first clock CLK1 and a duty cycle of the second clock CLK2 is substantially smaller than a duty cycle of the first clock CLK1; a transistor 225 (which is an NMOS (n-channel metal-oxide semiconductor field effect) transistor, in this particular embodiment) for receiving the second clock CLK2 and outputting a current signal $I_{CLK}$; a transmission line 220 for receiving the current signal $I_{CLK}$ at a first end 221 and transmitting the current signal $I_{CLK}$ to a second end 222; a termination circuit 230 (which comprises a resistor 231 in this particular embodiment) for receiving the current signal $I_{CLK}$ at the second end 222 and converting the current signal $I_{CLK}$ into a voltage signal $V_{CLK}$, and an edge detection circuit 240 (comprising an inverter 241 in this particular embodiment) for receiving the voltage signal $V_{CLK}$; and outputting a third clock CLK3, wherein an edge (which is a rising edge, in this particular embodiment) of the third clock CLK3 is associated with an edge (which is a falling edge) of the voltage signal $V_{CLK}$.

Figure 3:
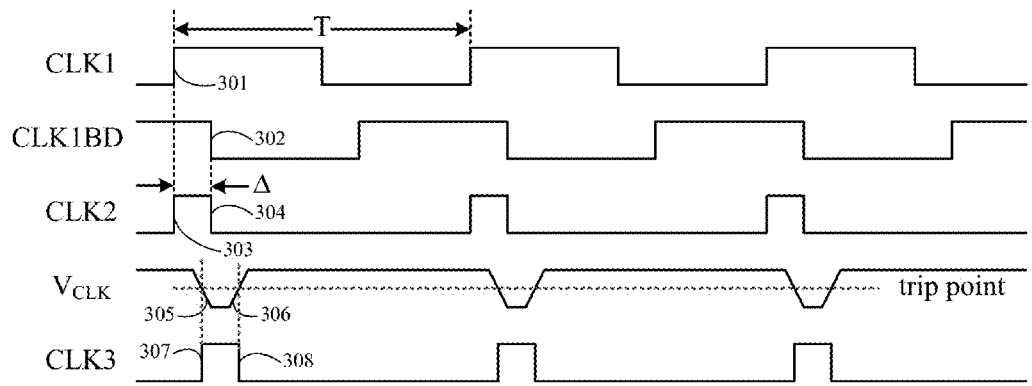
FIG. 3 shows an exemplary timing diagram for the clock transmission circuit of FIG. 2.

An exemplary timing diagram for circuit 200 is shown in FIG. 3. The first clock CLK1 is a square wave with period of T. The inverting delay cell 211 receives the first clock CLK1 and outputs an intermediate clock CLK1DB, which is an inversion of the first clock with a delay of Δ. That is, a falling edge 302 of CLK1DB follows a rising edge 301 of CLK1 with a time separation of Δ. The second clock CLK2 is obtained by an AND operation is performed on the first clock CLK1 and the intermediate clock CLK1DB. A rising edge 303 of the second clock CLK2 is substantially aligned with the rising edge 301 of the first clock, while a falling edge 304 of the second clock follows with a time separation of Δ. NMOS transistor 225 performs an inversion operation and transmission line 220 causes dispersion. Therefore, the voltage signal $V_{CLK}$ is a delayed and inverted signal with an appreciable rise/fall time. The falling edge 305 is a delayed inversion of the rising edge 303 with an appreciable fall time, while the rising edge 306 is a delayed inversion of the falling edge 304 with an appreciable rise time. Finally, the edge detection circuit 240 converts the voltage signal $V_{CLK}$ into the third clock CLK3 by comparing voltage signal $V_{CLK}$ with a trip point, where the trip point is shown in FIG. 3.

The duty cycle of the second clock CLK2 is Δ/T, which can be made substantially smaller than that of the first clock CLK1 as long as the delay D of the inverting delay cell 211 is properly set. Since the second clock CLK2 instead of the first clock CLK1 is used to control the transistor 225, the transistor 225 is turned on for a substantially shorter time than in conventional systems where the transistor 225 directly responds to the first clock CLK1. Therefore, the circuit 200 may consume substantially less power than conventional systems.

Figure 4:
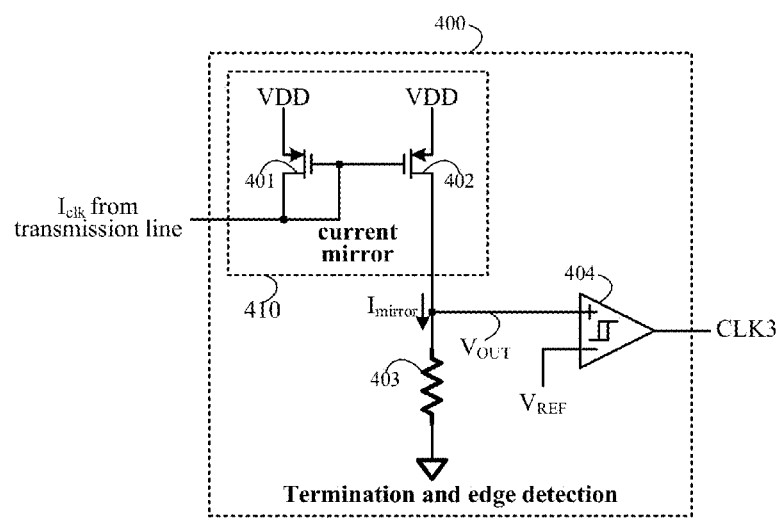
FIG. 4 shows a schematic diagram of an alternative embodiment suitable for embodying the termination and edge detection functions for the clock transmission circuit of FIG. 2.

The principle of the clock transmission technique disclosed may be practiced in numerous alternative embodiments. In one embodiment, the edge detection circuit 240 of FIG. 2 is embodied as a comparator that compares the voltage signal $V_{CLK}$ with a reference voltage $V_{REF}$ that sets the trip point. In one embodiment, the termination circuit 230 and the edge detection circuit 240 is replaced by a circuit 400, as depicted in FIG. 4. Circuit 400 comprises: a current mirror 410 comprising a first PMOS (p-channel metal-oxide semiconductor field effect) transistor 401 and a second PMOS transistor 402 for receiving the current signal $I_{CLK}$ and providing a mirroring effect, as represented by mirrored current signal $I_{mirror}$; a resistor 403 for receiving the mirrored current signal $I_{mirror}$ and converting it into a voltage signal $V_{OUT}$; and a comparator 404 for comparing the voltage signal $V_{OUT}$ with a reference voltage $V_{REF}$ and outputting the third clock CLK3. As the comparator itself is well known in the prior art, additional details relating to the comparator are not provided.

Those skilled in the art will readily appreciate that numerous modifications and alterations of the clock transmission apparatus and method may be made while retaining the teachings of the disclosure.

What is claimed is:

1. An apparatus comprising:
   an edge extraction circuit for receiving a first clock signal and outputting a second clock signal, wherein a duty cycle of the second clock is substantially smaller than a duty cycle of the first clock;
   a transistor for receiving the second clock signal and outputting a current signal;
   a transmission line for receiving the current signal on a first end and transmitting the current signal to a second end;
   a termination circuit for receiving the current signal at the second end and converting the current signal into a voltage signal; and
   an edge detection circuit for outputting a third clock by detecting an edge of the voltage signal;
   wherein the termination circuit comprises:
      a current mirror for mirroring the current signal to generate a mirrored current signal, and
      a termination device for converting the mirrored current signal into the voltage signal.

2. The apparatus of claim 1, wherein the edge extraction circuit further comprises:
   an inverting delay circuit for receiving the first clock and outputting an intermediate clock that is an inversion of the first clock with a delay; and
   an AND gate for receiving the first clock and the intermediate clock and outputting the second clock signal.

3. The apparatus of claim 1, wherein the termination circuit comprises a resistor.

4. The apparatus of claim 1, wherein the edge detection circuit comprises an inverter.

5. The apparatus of claim 1, wherein the edge detection circuit comprises a comparator.

6. A method comprising:
   receiving a first clock signal;
   generating, by an edge extraction circuit, a second clock signal such that a period of the second clock signal is the same as a period of the first clock signal and a duty cycle of the second clock signal is substantially smaller than a duty cycle of the first clock signal;
   converting, by a transistor, the second clock signal into a current signal;
   transmitting the current signal via a transmission line at a first end;
   receiving the current signal at a second end of the transmission line;
   converting the current signal received at the second end of the transmission line into a voltage signal using a termination circuit; and
   generating a third clock from the voltage signal using an edge detection circuit;
   wherein the termination circuit comprises:
      a current mirror for mirroring the current signal into a mirrored current signal, and
      a termination device for converting the mirrored current signal into the voltage signal.

7. The method of claim 6, wherein the edge extraction circuit comprises:
   an inverting delay circuit for receiving the first clock and outputting an intermediate clock that is an inversion of the first clock with a delay, and
   an AND gate for receiving the first clock and the intermediate clock and outputting the second clock signal.

8. The method of claim 6, wherein the termination circuit comprises a resistor.

9. The method of claim 6, wherein the edge detection circuit comprises an inverter.

10. The method of claim 6, wherein the edge detection circuit comprises a comparator.

11. An apparatus comprising:
   an edge extraction circuit for receiving a first clock signal and generating a second clock based on reducing the duty cycle of the first clock;
   a transistor for receiving the second clock signal and outputting a current signal;
   a transmission line for transmitting the current signal from a first end to a second end;
   a termination circuit for receiving the current signal at the second end and converting the current signal into a voltage signal; and
   an edge detection circuit for outputting a third clock based on at least one characteristic of the voltage signal;
   wherein the termination circuit comprises:
      a current mirror for generating a mirrored current signal, and
      a termination device for converting the mirrored current signal into the voltage signal.

12. The apparatus of claim 11, wherein the edge extraction circuit further comprises:
   an inverting delay circuit for inverting the first clock and adding a delay to the inverted first clock to generate an intermediate clock; and
   an AND gate for generating the second clock signal based on the first clock and the intermediate clock.

13. The apparatus of claim 11, wherein the termination circuit comprises a resistor coupled to a power supply node.

14. The apparatus of claim 11, wherein the edge detection circuit comprises an inverter.

15. The apparatus of claim 11, wherein the at least one characteristic of the voltage signal comprises timing associated with one of a falling edge or a rising edge of the voltage signal.

* * * * *